United States Patent [19]

Kobayashi et al.

[11] Patent Number: 4,693,758

[45] Date of Patent: Sep. 15, 1987

[54] METHOD OF MAKING DEVICES IN SILICON, ON INSULATOR REGROWN BY LASER BEAM

[75] Inventors: Yutaka Kobayashi, Hitachi; Takaya Suzuki, Katsuta, both of Japan

[73] Assignee: Hitachi, Ltd., Tokyo, Japan

[21] Appl. No.: 784,033

[22] Filed: Oct. 4, 1985

Related U.S. Application Data

[62] Division of Ser. No. 275,128, Jun. 18, 1981, abandoned.

[30] Foreign Application Priority Data

Jun. 18, 1980 [JP] Japan .................................. 55-81420

[51] Int. Cl.[4] .................. H01L 21/263; H01L 21/225
[52] U.S. Cl. ..................................... 437/174; 357/42; 357/91; 437/56
[58] Field of Search .................. 148/1.5, 187, 175; 29/571, 576 B; 357/42, 91

[56] References Cited

U.S. PATENT DOCUMENTS 4,323,417  4/1982  Lam ..................................... 156/613
4,385,937  5/1983  Ohmura .............................. 148/1.5

FOREIGN PATENT DOCUMENTS 56-46522  4/1981  Japan .

OTHER PUBLICATIONS

Kobayashi et al., Jap. Jour. Appl. Phys., 20 (Apr. 1981), L-249.
Yaron et al., Appl. Phys. Letts., 36 (Feb. 1980), 220.
Lüthy et al., Appl. Phys. Letts., 35 (1979), 873.
Roulet et al., Jour. Appl. Phys., 50 (1979), 5536.
Golecki et al., Nuclear Inst. Methods, 182 (1981), 675.
Foti et al., Appl. Phys., 15 (1978), 365.
Fang et al., IBM-TDB, 23 (Jun. 1980), 362.
Fang et al., IBM-TDB, 22 (1979), 1236.
Sai-Halasz et al., Appl. Phys. Letts., 36 (Mar. 1980), 419.
Gibbons et al., Appl. Phys. Letts., 34 (1979), 831.
Lau et al., Appl. Phys. Letts., 34 (1979), 76.
Yoshi et al., Conf. Solid St. Devices, 1981, Jap. Jour. Appl. Phys., 21 (1982), 175.

*Primary Examiner*—Upendra Roy
*Attorney, Agent, or Firm*—Antonelli, Terry & Wands

[57] ABSTRACT

This invention relates to improvements in the SOS technology including the so-called laser annealing processing. According to this invention, a semiconductor layer of an SOS structure consists of the three layers of an interface layer made up of twins, a seed crystalline layer and a re-grown layer far thicker than the preceding two layers when viewed from the side of an insulating substrate. The re-grown layer is formed in such a way that a semiconductor layer deposited on the insulating substrate is irradiated with an electromagnetic wave, for example, pulsed ruby laser beam, which is absorbed substantially uniformly by a portion except the interface layer and the seed crystalline layer. According to this invention, the quality of the re-grown layer is improved, and the mobility of carriers is enhanced. As a result, the operating speed of a semiconductor device employing the SOS structure is raised, and the leakage current is reduced.

27 Claims, 14 Drawing Figures

FIG. 7A
FIG. 8A
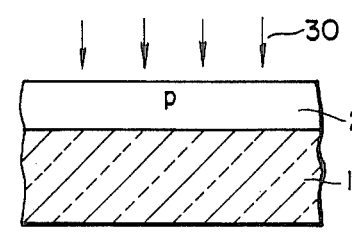
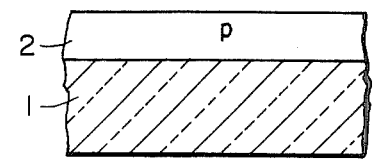
FIG. 7B
FIG. 8B
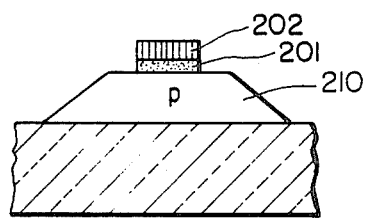
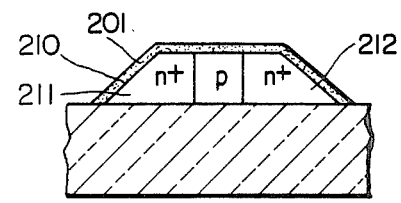
FIG. 7C
FIG. 8C
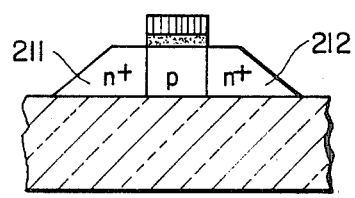
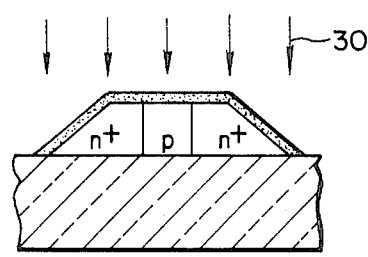
FIG. 7D
FIG. 8D
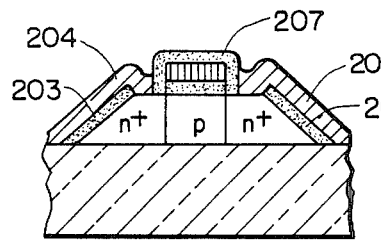
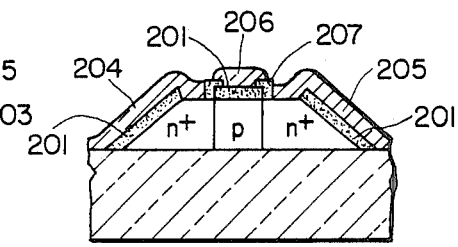

METHOD OF MAKING DEVICES IN SILICON, ON INSULATOR REGROWN BY LASER BEAM

This is a division of application Serial No. 275,128, filed June 18, 1981 now abandoned.

BACKGROUND OF THE INVENTION

This invention relates to improvements in the SOS technology, and more particularly to improvements in the crystalline quality of a single crystalline semiconductor layer formed on an insulating substrate.

As a semiconductor substrate for forming a semiconductor integrated circuit device (IC) therein, there has been proposed a structure in which a semiconductor single crystalline layer of Si or the like is grown on a highly insulating single crystalline substrate of sapphire, spinel or the like. Employing such structure (hereinbelow, typified by a sapphire plate on which Si is formed, and called "Silicon On Sapphire-SOS-structure"), a very thin semiconductor single crystalline layer in which semiconductor regions are to be formed can be realized without spoiling the mechanical strength of the semiconductor layer, and a high insulation can be achieved, so that a high speed IC, having high integration and low power dissipation, can be achieved.

Fundamentally, the SOS structure can be fabricated by a method similar to that of epitaxial growth of hitherto known semiconductors. With the conventional growth process, however, obtaining a satisfactory crystalline quality is difficult, for the reasons that an insulator has a very different lattice constant and coefficient of thermal expansion as compared to the lattice constant and coefficient of thermal expansions of semiconductors, and that the required thickness of the semiconductor single crystalline layer is extremely small, e.g., at most approximately 1 $\mu$m. Expecially when a high-speed semiconductor device such as a logic IC is to be fabricated employing the SOS structure, the mobility of carriers within the semiconductor single crystalline layer (hereinbelow, simply termed "mobility") needs to be sufficiently increased. With the prior art SOS structure, however, it has been difficult to increase the mobility to a satisfactory level, or at least to a value comparable to that of a bulk semiconductor. Therefore, the application of the SOS structure to high-speed ICs has been limited.

The mobility in the semiconductor is lowered by all factors which cause the carriers to be scattered. The factors are, for example, the lattice structure of the semiconductor crystal, impurity atoms doped in the semiconductor, and stacking faults, dislocations and strains introduced into the semiconductor. Among them, the stacking faults, dislocations and strains are the main factors causing the carriers to be scattered in the SOS structure and have rendered it difficult to raise the mobility.

More specifically, the substrate and the semiconductor deposited thereon have different lattice constants, and they form a so-called heterojunction therebetween, so that twins, dislocations or stacking faults appear in the interface of the two in large numbers. The number of such disorders decreases gradually from the interface toward the opposite surface of the semiconductor. Since, however, the semiconductor layer is as thin as, for example, 0.5-1 $\mu$m in the case of the IC of the SOS structure, a region in which the disorders have not sufficiently decreased cannot avoid being used as a part of a semiconductor element. It has therefore been impossible to make the mobility sufficiently high. By the same reason, it has been impossible to make the leakage current of the semiconductor element sufficiently low.

G. Yaron et al reported that a method of irradiating a Si layer with an excimer laser beam is effective for improving the crystalline quality of the top silicon surface of the SOS structure (G. Yaron and L. D. Hess, "LASOS-Laser Annealed Silicon On Sapphire", IEEE Trans. Electron Devices, vol. ED-27, pp. 573-578, March 1980). G. Yaron et al, aim at the crystalline quality of the top silicon surface and the reform of silicon islands. Therefore, they use the excimer laser (the wavelength $\lambda$ of the excimer laser is $\lambda = 2,490$ Å). They do not refer to the crystalline quality of the bulk of the SI layer of the SOS structure.

The irradiation of a Si layer with a laser beam has also been disclosed in U.S. Pat. No. 3,585,088. According to this patent, an amorphous film of silicon deposited on a substrate is irradiated with a ruby laser beam and is turned into single crystalline silicon. The object of this patent is to turn, in general, an amorphous or polycrystalline material into a single crystalline material. This patent does not refer to the improvement of the crystalline quality of the single crystalline film.

SUMMARY OF THE INVENTION

An object of this invention is to improve the crystalline quality of the semiconductor layer of an SOS structure.

Another object of this invention is to enhance the operating speed of a semiconductor device fabricated with an SOS structure.

Still another object of this invention is to reduce the leakage current of a semiconductor device fabricated with an SOS structure.

According to this invention, at least one of the above-mentioned objects is achieved by providing a semiconductor layer in an SOS structure as follows. The semiconductor layer deposited on an insulating substrate comprises an interface layer made of twins, i.e., made of a large number of single crystalline grains having varying crystallographic orientations, and a single crystalline semiconductor layer adjoined to the interface layer and extending to the top surface of the semiconductor layer. The single crystal semiconductor layer is thicker than the interface layer.

The single crystalline semiconductor layer comprises a seed layer adjoined to the interface layer which is to be left unaffected by an irradiation of an electromagnetic wave irradiated upon the top surface of the single crystalline semiconductor layer after deposition thereof, and a re-grown layer adjoining the seed layer and extending to the top surface of the single crystalline semiconductor layer which is re-crystallized from the as-deposited semiconductor layer by being affected by the irradiation with the electromagnetic wave. The seed layer is the seed for the re-crystallization to form the re-grown layer, whereby stress and disorders introduced into the single crystalline semiconductor layer during the deposition are decreased in number.

According to this invention, the wavelength, energy density and irradiation method of the electromagnetic wave to be used for the re-growth, or re-crystallization, are selected so that the electromagnetic wave can act substantially on almost all of the single crystalline semiconductor layer deposited previously to the irradiation (except the portion which serves as the seed layer) and can re-crystallize the semiconductor by the irradiation. As can be appreciated, the irradiated portion, that is re-grown, is thicker than the seed layer. The "regrowth" is, in the broadest sense, the process of the rearrangement of atoms and is, typically, a melting—solidification process. The inventors' study have revealed that, in order to enhance the operating speed and to reduce the leakage current of a semiconductor device, for example, an MOS transistor, fabricated with the SOS structure, the improvement of the crystalline quality of only the top surface of the semiconductor layer is insufficient, and the improvement of the crystalline quality of the bulk is also necessary. According to this invention, such requirement or necessity is fully met. In addition, the seed layer in this invention is necessary for rendering the re-grown layer single crystalline. Under conditions that the seed layer per se is melted, the twin layer acts as the seed of the re-growth and the re-grown layer becomes polycrystalline or amorphous, so that the objects of this invention are not achieved.

If where the semiconductor is Si, it is favorable to increase the operating speed to set the top main surface of the single crystalline Si layer at the orientation of $\{111\}$. Under such a condition that, after the electromagneticwave irradiation according to this invention, the SOS structure is not subjected to a heat treatment in which the substrate and the Si layer are simultaneously heated to 600° C. or above, it is favorable that the top main surface of the single crystalline Si layer has the orientation of $\{100\}$ or $\{110\}$.

Other objects and effects of this invention will become apparent from the following detailed description taken with reference to the accompanying drawings.

BRIEF DESCRIPTION OF THE DRAWINGS

FIGS. 7A to 7D are sectional views each showing an essential step in a preferred embodiment of making an N-channel MOS transistor in accordance with this invention.

FIGS. 8A to 8D are sectional views each showing an essential step in another preferred embodiment of making an N-channel MOS transistor in accordance with this invention.

DESCRIPTION OF THE PREFERRED EMBODIMENTS

First of all, a method for making an SOS structure according to this invention will be explained with reference to FIG. 1. A single crystalline sapphire substrate 1 having a diameter of approximately 50 mm, a thickness of approximately 0.3 mm and an orientation of ($1\bar{1}02$) was prepared. A Si layer 2 with an orientation of (100) was epitaxially grown on the sapphire substrate by pyrolyzing silane (SiH$_4$) in a hydrogen atmosphere at 1,020° C. Phosphine was used as a dopant source to achieve a donor level of about $3 \times 10^{16}$ cm$^{-3}$. The electron Hall mobility in the Si layer 2 of this SOS structure was about 240 cm$^2$/V·s on the average.

In the formation of the SOS structure utilizing chemical vapor deposition as stated above, in case where the single crystalline sapphire substrate used has the facial orientation of ($1\bar{1}02$), for example, the crystal faces of the initial region of Si that is grown are the two sorts of (100) and (110). Microscopically, the Si is not single crystalline but is a polycrystalline region in which two sorts of crystal grains of the different crystal faces aggregate. In the present invention, this region shall be termed the "interface layer". Such interface layer is formed up to a thickness of approximately 0.05 μm from the sapphire substrate by the conventional chemical vapor deposition, and contains a large number of stacking faults, Al atoms and O atoms introduced from the sapphire substrate by auto-doping, Si atoms which do not contribute to the formation of the crystal, and so forth.

The Si layer deposited on the interface layer becomes a single crystalline layer whose crystal face is (100). The single crystalline layer as grown, however, still includes large numbers of stacking faults and dislocations, so that the mobility of carriers remains at the low value as described above.

Figure 1:
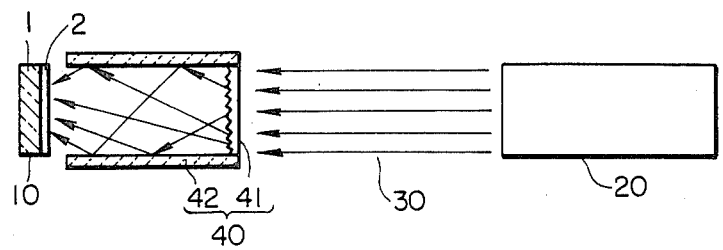
FIG. 1 is a view schematically showing the arrangement of a laser beam irradiation method and apparatus for use in an embodiment of this invention.

Subsequently, the SOS structure was irradiated with a laser beam as shown in FIG. 1. In this figure, numeral 10 designates the SOS structure consisting of the sapphire substrate 1 and the n-type single crystalline Si layer 2. The interface layer is not shown for clarity. Numeral 20 indicates a laser source, numeral 30 the laser beam emitted from the laser source 20, and numeral 40 a device for making the laser beam 30 uniform. The device 40 consists of a diffuser 41 and a reflector 42. The laser source 20 used in this example was a Q-switched ruby laser, whose wavelength λ was 6,943 Å and pulse width of one irradiation was 25 nsec. As the diffuser 41, a plate of ground glass is usable. Usable as the reflector 42 is a quartz cylinder whose inner surface is coated with a reflective material. Three different laser energies were utilized, 1.0 J/cm$^2$, 1.5 J/cm$^2$ and 2.5 J/cm$^2$, and the Hall mobility of the Si layer 2 after the respective irradiations were measured. The mobility is in a substantially proportional relationship with the operating speed of an IC.

As a result, in the case where the energy was 1.0 J/cm$^2$, the Hall mobility after the irradiation did not exhibit a substantial change from that before the irradiation. Although the irradiation was conducted repeatedly in a range of two times to five times, the Hall mobility did not substantially change from the value without the irradiation. Next, in the case where the energy was 1.5 J/cm$^2$, the Hall mobility after the first irradiation was 270 cm$^2$/V·s on the average and merely increased to some extent in comparison with the value before the irradiation. However, when the irradiation step was repeated by the second, third and fourth times, the Hall mobility exhibited large values in such manner that the value after the second irradiation was approximately 540 cm$^2$/V·s and increased about double in comparison with the value of the Si layer without the irradiation, that the value after the third irradiation was approximately 560 cm$^2$/V·s, and that the value after the fourth irradiation was approximately 580 cm$^2$/V·s. Next, in the case where the energy was 2.5 J/cm$^2$, the Hall mobility was extremely low, approximately 10 cm$^2$/V·s. In addition, the n-type Si layer was inverted into the p-type.

The above experimental results are summarized in the following table.

TABLE

| Energy density (J/cm$^2$) | Hall mobility (cm$^2$/V · s) Times of irradiation | | | | | Notes |
|---|---|---|---|---|---|---|
| | 0 | 1 | 2 | 3 | 4 | 5 | |
| 1.0 | 240 | 170 | — | 280 | — | 195 | — |
| 1.5 | 240 | 270 | 540 | 560 | 580 | 380 | — |
| 2.5 | 240 | 10 | — | — | — | — | n-Si changed to p-Si. |

The Si layers of the SOS structures subjected to the two or more times of irradiation and re-growth steps at the energy density of 1.5 J/cm$^2$ were treated with a defect delineation etch solution, and the resultant surfaces were observed with a scanning electron microscope. As a result, the stacking faults were hardly observed, and the number of etch pits corresponding to the dislocations decreased to $\frac{1}{8}$-1/5 in comparison with the number in the Si layer not irradiated.

The cause for lowering of the Hall mobility in the extreme at the energy density of 2.5 J/cm$^2$ may be that the energy was excessive for the Si layer was used in the example, so that the entire Si layer including the interface layer was molten by the irradiation, with the result that the crystal serving as the seed during the re-growth turned into twins and that a polycrystalline or amorphous Si layer was re-grown. The cause for the p-type inversion is conjectured to be that since the interface between the sapphire substrate and the Si layer was excessively heated, and Al atoms in the sapphire substrate were introduced into the molten Si and spread into the Si layer along with the re-growth of Si.

The cause of no effect being demonstrated at an energy of 1.0 J/cm$^2$ is not clear, but is conjectured to be that the energy of 1.0 J/cm$^2$ is insufficient for melting or re-growing the deposited Si layer. Even with the equal energy of 1.0 J/cm$^2$, when the wavelength of the laser is short, the absorption coefficient in Si increases, and a very thin top surface part of the Si layer is molten. For example, when the excimer laser whose wavelength λ is 2,480 Å is used, an extent of approximately 10$^{-7}$ cm or 10$^{-3}$ μm from the top surface is molten because the absorption coefficient of Si at this wavelength is approximately 10$^7$ cm$^{-1}$. Since, however, the thickness of the Si layer of the SOS structure for use in an IC is ordinarily 0.4–0.5 μm or greater, the effect of this invention cannot be expected with the lowenergy laser of such short wavelength. In the case where a short-wavelength laser is operated at high energy, unfavorably the surface of the Si layer is overheated to near the boiling point of Si to deteriorate the crystalline quality in the surface because most of the energy is absorbed within the top surface. In, for example, a MOS type transistor, such deterioration of the crystalline quality in the Si surface appears as the dispersion of the threshold voltage $V_{th}$. Thus, the electromagnetic wave for use in the present invention needs to melt or re-grow substantially the whole semiconductor layer uniformly, with the exception of the bottom portion of such layer, as discussed previously.

In the foregoing case where the energy was made 1.5 J/cm$^2$ with the Q-switched ruby laser, the Hall mobility after repeating the irradiation five or more times was approximately 380 cm$^2$/V·s, which is lower than the value after repeating the irradiation two to four times. Accordingly, the repeated irradiation of 2–4 times is desirable under the irradiation conditions stated above.

Figure 2:
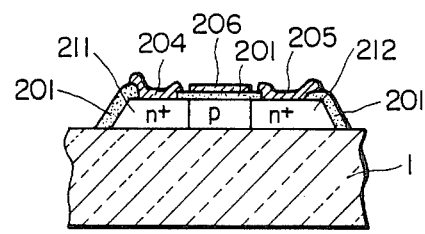
FIG. 2 is a sectional view of an N-channel MOS transistor which is an embodiment of this invention.

Now, an example of a MOS transistor fabricated in accordance with this invention will be described, with reference to FIG. 2. The SOS structure prepared by the foregoing process was used, where the energy density was 1.5 J/cm$^2$ and the number of times of the irradiation was three. Using known photolithography, selective diffusion, oxide-film forming technique etc., a MOS transistor shown in FIG. 2 was formed in the Si layer of this SOS structure. In the figure, numeral 212 designates a source region, numeral 211 a drain region, numerals 205, 204 and 206 source, drain and gate electrodes respectively, and numeral 201 an SiO$_2$ film. As a result, the source-drain leakage current was approximately 6×10$^{-13}$ A/μm. In contrast, the sourcedrain leakage current of an MOS transistor fabricated by the use of an SOS structure which was formed similarly to the above example except that the laser irradiation according to this invention was not performed was approximately 3×10$^{-11}$ A/μm and was inferior to the value of the above example. In this manner, according to the present invention, the leakage current can be made much lower, and hence, the industrial production of a dynamic MOS-LSI etc., which previously had been difficult to fabricate with the SOS structure, can be achieved.

Now, another embodiment of this invention will be described. In the present embodiment, the orientation of the top main surface of the Si layer of the SOS structure is made {111}. This embodiment is the same as the foregoing embodiment in point of employing the melting and regrowing process by the laser beam. The reason for the selection of the orientation of {111} is as follows. In general, a substrate has a greater coefficient of thermal expansion than a semiconductor. When after growing the semiconductor on the substrate at a high temperature in order to prepare the SOS structure, the temperature has been lowered down to room temperature, a compressive stress remains in the semiconductor on account of the difference between the coefficients of thermal expansion. Due to the compressive stress, the mobility in the SOS structure lowers. It has been revealed that in case of, for example, an SOS structure in which silicon of (100) has been deposited from the vapor phase or sapphire at approximately 1,000° C., the residual compressive stress in the silicon layer becomes as great as about 7 kbar, with the result that the electron Hall mobility decreases to about 60% in comparison with a value in the absence of the stress. As to Si the crystallographic orientation of {111}, which is the general expression of the orientation of (110), and other orientations crystallographically equivalent thereto, is free from the degradation of the mobility upon the application of the compressive stress in contrast to the other crystal faces. The present embodiment utilizes both the favorable property of {111} orientation of Si and disorder reducing processings including the melting treatment with the laser beam.

In the example, sapphire whose orientation was (0001) was used as a substrate, and an Si layer was deposited from the vapor phase thereon under the same conditions as in the foregoing embodiments, thereby to obtain an SOS structure in which the top main surface of the Si layer had the orientation of (111). Even when orientation of sapphire is (११२̄0) or (११२̄4), the same result is obtained. As in the foregoing embodiments, the SOS structure was irradiated with the beam of the Q-switched ruby laser to carry out the process for melting and re-growing the Si layer. As an example, the energy density was 1.5 J/cm$^2$ and the irradiation was conducted three times, and an MOS transistor as shown in FIG. 2 was fabricated.

Figure 3:
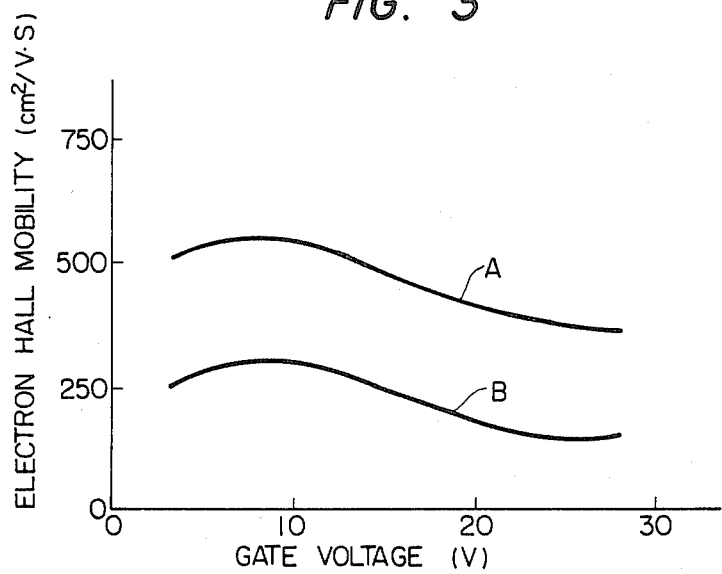
FIG. 3 is a graph showing the variation of the electron Hall mobility versus the gate voltage in an N-channel MOS transistor fabricated in accordance with an embodiment of this invention, in comparison with that in a prior art example.
Figure 4:
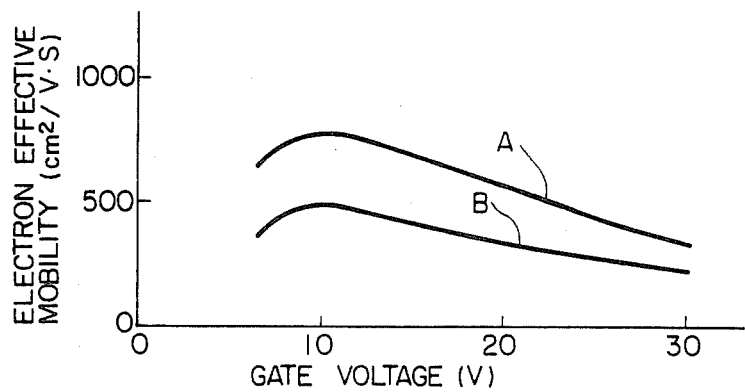
FIG. 4 is a graph showing the variation of the electron effective mobility (or channel mobility) versus the gate voltage in the N-channel MOS transistor fabricated in accordance with the embodiment of this invention, in comparison with that in the prior art example.

The relationship in the MOS transistor between the gate—source voltage (hereinbelow, simply termed "gate voltage") and the electron Hall mobility is illustrated in FIG. 3, while the relationship between the gate voltage and the electron effective mobility is illustrated in FIG. 4. In each of the figures, letter A indicates a result using the MOS formed by the example. Letter B indicates a result using an MOS formed by a comparative procedure in which an Si layer had the orientation of (110) but was not subjected to the laser-beam irradiation treatment of this invention. The Hall mobility in FIG. 3 indicates the mobility of the whole Si region in FIG. 2. The effective mobility in FIG. 4 indicates the mobility of a channel region (the surface part of the p-type Si region opposing the gate electrode), and is also called the "channel mobility". According to FIGS. 3 and 4, the present embodiment, shown by A, has sharply increased mobilities, in both the Hall mobility and the channel mobility, relative to the results when using the comparative procedure, as shown by B. In the MOS transistor, the operating speed is proportional to he channel mobility. It is accordingly understood from FIG. 4 that, in comparison with the comparative procedure, with the invention of the present embodiment there is a sharply increased operating speed of the MOS transistor formed.

Figure 5:
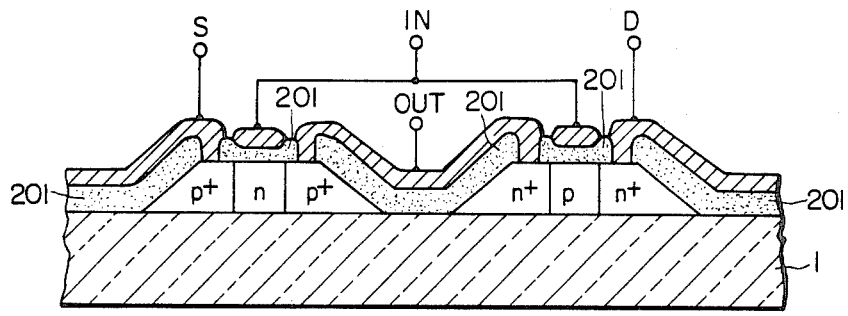
FIG. 5 is a view showing a section of complementary MOS transistors according to another embodiment of this invention, exemplifying interconnections for constructing an inverter circuit.

The present embodiment is applicable to all kinds of semiconductor devices having SOS structures, but it is particularly suitable for a semiconductor device in which both a PMOS type semiconductor element and a NMOS type type semiconductor element exist in an identical SOS structure, for example, a semiconductor device which includes CMOS transistors. The reason is that the Si single crystal having the orientation {111} used in the present embodiment exhibits higher mobilities in both the p-type and the n-type under the action of the compressive stress than in the unstressed condition. By way of example, in case where the carrier density is $10^{16}$ cm$^{-3}$ and where the compressive stress of 7 kbar acts, the Si single crystal having the orientation {111} has its effective mobility in the n-type Si raised to approximately 103% and its effective mobility in the p-type Si raised to approximately 130% with respect to the values in the unstressed condition. Accordingly, the operating speeds of the CMOS transistors increase. FIG. 5 shows an example of such CMOS transistors. Symbols used are the same as in FIG. 2. In FIG. 5, a transistor on the left side is of the PMOS type, and a transistor on the right side is of the NMOS type. FIG. 5 also illustrates an example of interconnections for employing these transistors as an inverter.

Now, still another embodiment of this invention will be described. The present embodiment is characterized in that the facial orientation of a Si single crystalline layer is made {100} or {110} and characterized in that the portion of the Si single crystalline layer including at least the exposed main surface thereof is re-grown such that a tensile stress acts thereon. When the tensile stress is applied to the Si layer whose facial orientation is {100} or {110}, the mobility of the Si layer increases. In accordance with the melting and re-growing process based on irradiation with an electromagnetic wave, such as a laser beam, according to this invention, most of the energy of the irradiating laser is absorbed within the Si single crystalline layer, and a sapphire substrate is held at the normal temperature without being heated. Accordingly, the self-contraction of the molten Si at the re-growth to the single crystal tends to be hampered by the sapphire substrate and the Si single crystalline layer (solid phase) adjacent thereto, and a tensile stress remains in the single crystalline layer. The inventors' experiment has revealed, however, that the mobility degrades when the SOS structure with its mobility thus increased is subjected to a high-temperature heat treatment for fabricating a semiconductor device, such as doping with an impurity. The present embodiment prevents the degradation of the mobility by a method to be described below.

Figure 6:
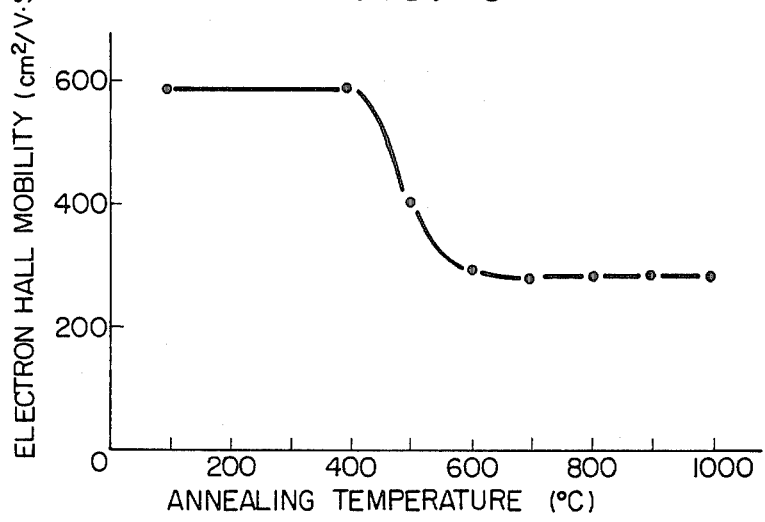
FIG. 6 is a graph showing the variation of the electron Hall mobility versus the annealing temperature after irradiation with a laser beam, in the case where the top silicon main surface has the orientation of (100).

Description will be made with reference to FIG. 6. This figure illustrates the electron Hall mobilities within the Si single crystalline layer at the times when the SOS structure having the Si layer of the (100) crystal whose mobility has been enhanced by laser irradiation according to this invention has been annealed at various temperatures. The annealing was conducted for the whole SOS structure, and the annealing time thereof was about 40 minutes at any of the temperatures. As apparent from FIG. 6, when the annealing temperature is below 600° C., the effect of the increase of the mobility appears more or less with respect to the SOS structure not irradiated by the laser, but it cannot be expected at or above 600° C. An annealing temperature of or below 400° C. is favorable because the mobility increased by the laser irradiation is not degraded.

It has been found that the above tendency applies, not only when the whole SOS structure is heated, but also when either the substrate or the SI single crystalline layer is heated to the aforecited temperature. For example, as long as the temperature of the substrate is held at or below 400° C., the mobility does not degrade even if the Si single crystalline layer is heated to or above 600° C. The same applies when the temperatures of the substrate and the Si single crystalline layer is in the converse relation to the above. It is accordingly possible to obtain a semiconductor device of the SOS structure having a high operating speed in such a way that the semiconductor device is produced by forming the re-grown layer according to this invention and thereafter holding at least one of the substrate and the Si single crystalline layer at a temperature below 600° C., desirably at or below 400° C. The present embodiment is applicable to the above-stated Si single crystalline layer having the facial orientation of (100), and besides, to Si single crystalline layers whose main surfaces are faces generally equivalent to the face (100) in the crystallographic sense (the faces are denoted by the {100} face) and the {110} face.

Hereunder, the present embodiment will be described with reference to FIGS. 7A to 7D and FIGS. 8A to 8D by taking the fabrications of NMOS transistors as examples.

Reference will be had to FIGS. 7A to 7D. On one main surface of a sapphire substrate 1, a p-type Si single crystalline layer 2 whose main surface has the facial orientation of (100) was deposited from the vapor phase at about 1,000° C. Using the apparatus shown in FIG. 1, the Si single crystalline layer 2 was irradiated with a laser beam 30 to form a re-grown layer. The conditions of the irradiation were the same as stated before. (FIG. 7A)

Subsequently, the Si single crystalline layer 2 was selectively etched with a KOH solution at the normal temperature, thereby to form a Si single crystalline island 210. On the exposed part of the Si single crystalline island 210, a $SiO_2$ film 201 and a Si polycrystalline layer 202 were successively deposited by the plasma CVD process at about 400° C., whereupon parts other than parts to serve as the gate portion of the MOS transistor were removed by photolithography. The highest temperature during the photolithography was at the baking of a photoresist film, and the substrate temperature at this stage was about 100° C. (FIG. 7B)

Next, those parts of the Si single crystalline island 210 which were not covered with the $SiO_2$ film 201 were doped with an impurity for establishing the n-type, such as phosphorus, by the ion implantation process so as to form a source region 211 and a drain region 212. The temperature of the substrate 1 at the ion implantation was about 100° C. Thereafter, the source region 211 and the drain region 212 were subjected to laser annealing in order to activate the implanted ions. Herein, a continuous-wave laser was used. Although the temperature of the surfaces of the source region and drain was raised to or above approximately 1,000° C. by the laser irradiation, the substrate 1 was held at the normal temperature. (FIG. 7C)

At the next step, the portions of the Si single crystalline island 210 where electrodes were not to be formed were covered with $SiO_2$ films 203 and 207 by the plasma CVD process at about 400° C. Thereafter, aluminum (Al) was evaporated at the normal temperature to form the source electrode 204 and the drain electrode 205. Then, the MOS transistor was finished up. (FIG. 7D)

The channel mobility in the MOS transistor of this example was 700–800 $cm^2/V \cdot s$. This value is much higher than the channel mobility of about 500 $cm^2/V \cdot s$ in a MOS transistor employing the prior art SOS structure which does not have the re-grown layer according to this invention.

The other example will be described with reference to FIGS. 8A to 8D. An SOS structure similar to that shown in FIG. 7A was prepared (FIG. 8A). Subsequently, a Si single crystalline island 210 was formed as in FIG. 7B. Thereafter, a source region 211 and a drain region 212 were formed by the use of conventional techniques of selective thermal diffusion etc. The temperature of the thermal diffusion may be a high temperature of, for example, 1,150° C. 201 denotes an $SiO_2$ film which was formed on the exposed surface of the Si single crystalline island 210 during the thermal diffusion step. (FIG. 8B)

Subsequently, the Si single crystalline island 210 was irradiated with a laser beam 30 to melt and re-grow the Si single crystal. The laser irradiation was conducted with the apparatus shown in FIG. 1, and the conditions of the irradiation were as stated in the explanation of the features of this invention. Since the $SiO_2$ film 201 is transparent with respect to the laser beam 30, it does not form an obstacle to the formation of the re-grown layer. (FIG. 8C)

Subsequently, the portion of the $SiO_2$ film 201 which corresponded to the position of source and drain electrodes was etched and removed at the normal temperature, and a $SiO_2$ film 207 was formed by the plasma CVD process at about 400° C. Thereafter, Al was evaporated at the normal temperature to form the source electrode 204, the drain electrode 205 and the gate electrode 206. Thus, the MOS transistor was finished up. (FIG. 8D)

The channel mobility in the MOS transistor of this example was 700–800 $cm^2/V \cdot s$, which was the same as in the foregoing example illustrated in FIGS. 7A to 7D. Although, in the present example, the gate electrode was formed of the evaporated Al film, it may well be a polycrystalline Si film as in the foregoing example if desired. Conversely, in the foregoing example, the gate electrode may well be formed of an evaporated metal film of Al or the like. Besides, insofar as at least one of the substrate and the Si single crystal after the formation of the re-grown layer is held at a temperature of below 600° C., processing other than that described above can be employed as desired. Further, in FIG. 8D, it is also allowed that without forming the $SiO_2$ film 207, the $SiO_2$ film 201 of the gate region is somewhat enlarged so as to cover the exposed ends of the p-n junctions between the gate region and the source and drain regions. At this time, the plasma CVD treatment for forming the $SiO_2$ film 207 is dispensed with.

While this invention has thus far been described in conjunction with the several embodiments, it is not restricted thereto but can also be realized in different aspects. Examples of the aspects will now be explained.

In the foregoing examples, a pulsed laser beam having a width of 25 nsec was used. However, this invention is not restricted to the aforecited pulse width, but a beam of a width narrower or broader than 25 nsec is also effective. A too broad width, however, is unfavorable because the substrate, such as of sapphire, is feared to be overheated due to the conduction of heat, to introduce such harmful impurities as Al atoms, from the sapphire substrate, into the semiconductor layer.

As the electromagnetic wave source usable in this invention, besides the ruby laser, any laser source may be employed as long as the laser is capable of emitting sufficient high power to melt substantially the whole region of the semiconductor layer uniformly, with the exception of the bottom portion, such laser source including a YAG laser ($\lambda = 10,640$ Å), glass layer ($\lambda = 10,600$ Å), $CO_2$ laser ($\lambda = 106,000$ Å) and Ar laser ($\lambda = 5,145$ Å). Not only lasers, but also a flash lamp or a mercury-vapor lamp may be employed. Further, the method of irradiation with the laser beam can be subject to various modifications, and is not restricted to the method and apparatus shown in FIG. 1.

The material to which this invention is applied is not restricted to Si on sapphire, but it may be Si on spinel, Ge on sapphire, Ge on spinel, or a semiconductor on glass of $SiO_2$ or the like or on an insulating film such as silicon nitride film, and it may well be a compound semiconductor. The semiconductor element formed may well be others than the MOS transistor.

As set forth above, this invention is effective to provide a semiconductor device in which the crystalline quality of the semiconductor layer of an SOS structure is improved to reduce the leakage current and to enhance the operating speed.

We claim:

1. A method of forming a single crystalline semiconductor layer comprising the steps of:
   (a) depositing a layer of semiconductor material on a main surface of an insulating substrate, said layer of semiconductor material comprising an interface sublayer adjacent said main surface of the insulating substrate and a single crystalline semiconductor sublayer formed continuously on the interface sublayer, the single crystalline semiconductor sublayer having an exposed surface not adjacent the interface sublayer, said interface sublayer being made up of an aggregate of single crystalline semiconductor grains, said single crystalline semiconductor sublayer having a predetermined orientation and
   (b) irradiating a portion of said single crystalline semiconductor sublayer with an electromagnetic wave which has energy and a wavelength required to re-grow said portion substantially uniformly, from the exposed surface of said single crystalline semiconductor sublayer; said portion being all of said single crystalline semiconductor sublayer other than a seed layer part of said single crystalline semiconductor sublayer, adjacent said interface sublayer, that is necessary for serving as a seed of the re-growth.

2. A method of forming a single crystalline semiconductor layer according to claim 1, wherein the wavelength, the energy and an irradiation period of said electromagnetic wave used in the step (b) are selected in a range sufficient for uniformly melting said portion and insufficient for heating said portion up to a boiling point of the semiconductor material.

3. A method of forming a single crystalline semiconductor layer according to claim 1, wherein the step (b) is performed a plurality of times until a mobility of carriers in the re-grown part increases.

4. A method of forming a single crystalline semiconductor layer according to claim 1, wherein said insulating substrate used in the step (a) is of single crystalline sapphire or single crystalline spinel and the semiconductor material is silicon grown from a vapor phase, and said electromagnetic wave used in the step (b) is a pulsed ruby laser beam.

5. A method of forming a single crystalline semiconductor layer according to claim 1, wherein the single crystalline semiconductor sublayer is made of silicon, and the orientation of the top main surface thereof is {111}.

6. A method of forming a single crystalline semiconductor layer according to claim 1, wherein said interface sublayer had a thickness of approximately 0.05 μm.

7. A method of forming a single crystalline semiconductor layer according to claim 1, wherein said irradiating is performed at an energy density of 1.5 J/cm².

8. A method of forming a single crystalline semiconductor layer according to claim 1, wherein the orientation of the top main surface of the single crystalline semiconductor sublayer is {100} or {110}, and wherein the step (b) is performed such that the single crystalline semiconductor sublayer is under a tensile stress after the re-growth.

9. A method of forming a single crystalline semiconductor layer according to claim 1, wherein said electromagnetic wave used in step (b) is from a laser source selected from the group consisting of YAG laser, glass laser, CO₂ laser and Ar laser.

10. A method of forming a semiconductor layer according to claim 1, wherein the single crystalline semiconductor sublayer is thicker than the interface sublayer.

11. A method of producing a semiconductor layer according to claim 1, wherein said portion is thicker than said seed layer part.

12. A method of forming a semiconductor layer according to claim 1, wherein said portion of the single crystalline semiconductor sublayer is the bulk of the single crystalline semiconductor sublayer.

13. A method of forming a single crystalline semiconductor layer according to claim 3, wherein said electromagnetic wave used in the step (b) is a pulsed laser beam.

14. A method of forming a single crystalline semiconductor layer according to claim 3, wherein said irradiating is performed at an energy density of 1.5 J/cm².

15. A method of forming a single crystalline semiconductor layer according to claim 3, wherein the step (b) is performed 2-4 times.

16. A method of producing a semiconductor layer according to claim 10, wherein said portion is thicker than said seed layer part.

17. A method of forming a single crystalline semiconductor layer according to claim 14, wherein the step (b) is performed 2-4 times.

18. A method of producing a semiconductor device comprising the steps of:
   (a) depositing a layer of semiconductor material on a main surface of an insulating substrate, said layer of semiconductor material comprising an interface sublayer adjacent said main surface of the insulating substrate and a single crystalline silicon sublayer formed continuously on the interface sublayer, the single crystalline silicon sublayer having an exposed surface not adjacent the interface sublayer, said interface sublayer being made up of an aggregate of single crystalline silicon grains, said single crystalline silicon sublayer having an orientation of {100} or {110},
   (b) irradiating a portion of said single crystalline silicon sublayer with an electromagnetic wave which has energy and a wavelength required to melt said portion substantially uniformly, from the exposed surface of said single crystalline silicon sublayer; said portion being all of said single crystalline silicon sublayer other than a seed layer within said single crystalline silicon sublayer, adjacent said interface sublayer, that is necessary for serving as a seed of re-growth,
   (c) re-growing the molten single crystalline silicon layer with said seed layer part as the seed, a temperature of said insulating substrate being held lower than that of said silicon layer at this time thereby to leave a tensile stress in at least the top main surface of the re-grown single crystalline silicon layer, and
   (d) subjecting an inner or surface part of said re-grown layer to at least one treatment of a manufacturing process of the desired semiconductor device under a temperature condition under which at least one of said re-grown layer and said insulating substrate is kept at a temperature of below 600° C.

19. A method of producing a semiconductor device according to claim 18, wherein the temperature condition in the step (d) is that at least one of said re-grown layer and said insulating substrate is at a temperature not higher than 400° C.

20. A method of producing a semiconductor device according to claim 18, wherein the manufacturing process of the semiconductor device in the step (d) includes a doping treatment in which a predetermined part of said re-grown layer is doped with predetermined impurity atoms, and a passivation treatment in which a predetermined exposed surface part of said re-grown layer is passivated.

21. A method of producing a semiconductor device according to claim 18, wherein the step (d) includes forming first and second MOS semiconductor elements, of opposite conductivity type, in said single crystalline silicon sublayer.

22. A method of producing a semiconductor device according to claim 18, wherein the single crystalline silicon sublayer is thicker than the interface sublayer.

23. A method of producing a semiconductor device according to claim 18, wherein said portion is thicker than the seed layer part.

24. A method of producing a semiconductor device according to claim 20, wherein said portion of the single crystalline silicon sublayer is the bulk of the single crystalline silicon sublayer.

25. A method of producing a semiconductor device according to claim 20, wherein the step (d) includes removing a part of the single crystalline silicon sublayer, including a part of the re-grown layer, so as to leave an island of the single crystalline silicon sublayer, said desired semiconductor device being formed in said island.

26. A method of producing a semiconductor device according to claim 21, wherein said first and second MOS semiconductor elements are first and second MOS transistors, whereby CMOS transistors are formed in the single crystalline silicon sublayer.

27. A method of producing a semiconductor device according to claim 22, wherein said portion is thicker than the seed layer part.

* * * * *